(12) United States Patent
Kong

(10) Patent No.: US 7,864,559 B2
(45) Date of Patent: Jan. 4, 2011

(54) DRAM MEMORY DEVICE WITH IMPROVED REFRESH CHARACTERISTIC

(75) Inventor: Yong-Ho Kong, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 242 days.

(21) Appl. No.: 12/164,299

(22) Filed: Jun. 30, 2008

(65) Prior Publication Data
US 2009/0262589 A1 Oct. 22, 2009

(30) Foreign Application Priority Data
Apr. 21, 2008 (KR) ...................... 10-2008-0036611

(51) Int. Cl.
*G11C 11/24* (2006.01)
(52) U.S. Cl. .................. 365/149; 365/145; 365/189.16; 365/190; 365/222
(58) Field of Classification Search ............. 365/145 X, 365/149 O, 189.16 X, 222 X, 145, 149, 190, 365/222
See application file for complete search history.

(56) References Cited
U.S. PATENT DOCUMENTS
6,490,216 B1 * 12/2002 Chen et al. .................. 365/222
6,853,595 B2 * 2/2005 Sawamura et al. .......... 365/195
7,440,352 B2 * 10/2008 Nam .......................... 365/222

FOREIGN PATENT DOCUMENTS
KR 1020040033256 A 4/2004
KR 1020050078242 A 8/2005
KR 1020060087199 A 8/2006

OTHER PUBLICATIONS
Notice of Allowance issued from Korean Intellectual Property Office on Aug. 26, 2009 with an English Translation.

* cited by examiner

*Primary Examiner*—VanThu Nguyen
(74) *Attorney, Agent, or Firm*—IP & T Group LLP

(57) ABSTRACT

A semiconductor memory device and a method for operating the same can improve a refresh characteristic of the semiconductor memory device by physically writing only logic low data in memory cells, irrespective of logic level of input data, either high or low. The semiconductor memory device includes a positive word line configured to control a first memory cell connected to a positive bit line, a negative word line configured to control a second memory cell connected to a negative bit line, and a word line control circuit configured to enable one of the positive word line and the negative word line according to a logic level of data in a write operation.

9 Claims, 2 Drawing Sheets

DRAM MEMORY DEVICE WITH IMPROVED REFRESH CHARACTERISTIC

CROSS-REFERENCE TO RELATED APPLICATION

The present invention claims priority of Korean patent application number 10-2008-0036611, filed on Apr. 21, 2008, which is incorporated by reference in its entirety.

BACKGROUND OF THE INVENTION

The present invention relates to a semiconductor memory device, and more particularly to a semiconductor memory device having an improved refresh characteristic, and a method for operating the same.

FIG. 1 illustrates a memory cell structure of a conventional semiconductor memory device.

The conventional semiconductor memory device includes a plurality of memory cells 101 to 108 each storing one data. Each of the memory cells 101 to 108 consists of one capacitor for storing the data, and one transistor for opening/closing the memory cell under control of a word line from WL<0> to WL<n>. That is, each of the memory cells 101 to 108 has a one-transistor & one-capacitor (1T-1C) structure.

In order to write/read data in a specific memory cell, the memory cell must be selected from the memory cells 101 to 108, which is performed by a row address of a word line from WL<0> to WL<n> and a column address of a pair of bit lines from BL0 to BL<k> and BLB0 to BLB<k> respectively. For example, in order to access the memory cell 101, a word line WL<0> is selected and enabled by the row address, and a pair of bit lines BL0 and BLB0 are selected by the column address. Then, data amplified by a bit line sense amplifier is input or output.

When data are stored in the capacitors of the memory cells, logic high data or logic low data are stored therein. However, the stored data are gradually lost by a leakage current as time elapses.

Accordingly, the semiconductor memory device periodically performs a refresh operation for updating the stored data in order to prevent the loss of data. That is, the semiconductor memory device inevitably performs the refresh operation because of loss of data caused by characteristics of the memory cells. If the semiconductor memory device could less frequently perform the refresh operation by increasing a data retention time of the memory cell, the performance of the semiconductor memory device would naturally be improved.

Therefore, there is a need for a technology that can increase the data retention time of the memory cells.

SUMMARY OF THE INVENTION

When data have a logic high level, the data stored in the memory cells are lost by discharge of electric charge. On the other hand, when data have a logic low level, the data stored in the memory cells are lost by introduction of electric charge. In view of characteristics of the semiconductor memory device, the discharge of the electric charges is far better performed than the introduction of the electric charges, the logic high data is lost more quickly than the logic low data.

Accordingly, if the memory cells are configured to physically store only logic low data, a refresh characteristic of the semiconductor memory device can be improved.

Embodiments of the present invention are directed to providing a semiconductor memory device and a method for operating the same, which can improve a refresh characteristic of the semiconductor memory device by physically writing only logic low data in memory cells, irrespective of logic level of input data, either high or low.

In accordance with an aspect of the invention, a semiconductor memory device includes a data storage unit configured to store data, which includes a first memory cell connected to a positive bit line and configured to be controlled by a positive word line, and a second memory cell connected to a negative bit line and configured to be controlled by a negative word line, wherein the positive word line and the negative word line are selected by a same row address.

In accordance with another aspect of the invention, a semiconductor memory device includes a positive word line configured to control a first memory cell connected to a positive bit line, a negative word line configured to control a second memory cell connected to a negative bit line, and a word line control circuit configured to enable one of the positive word line and the negative word line according to a logic level of data in a write operation.

In accordance with a further aspect of the invention, a method of operating a semiconductor memory device includes detecting a logic level of data to be written, and enabling a positive word line, which controls a first memory cell connected to a positive bit line, or a negative word line, which controls a second memory cell connected to a negative bit line, according to the detected logic level of the data.

DESCRIPTION OF SPECIFIC EMBODIMENTS

Hereinafter, a semiconductor memory device and a method for operating the same in accordance with the present invention will be described in detail with reference to the accompanying drawings.

Figure 1:
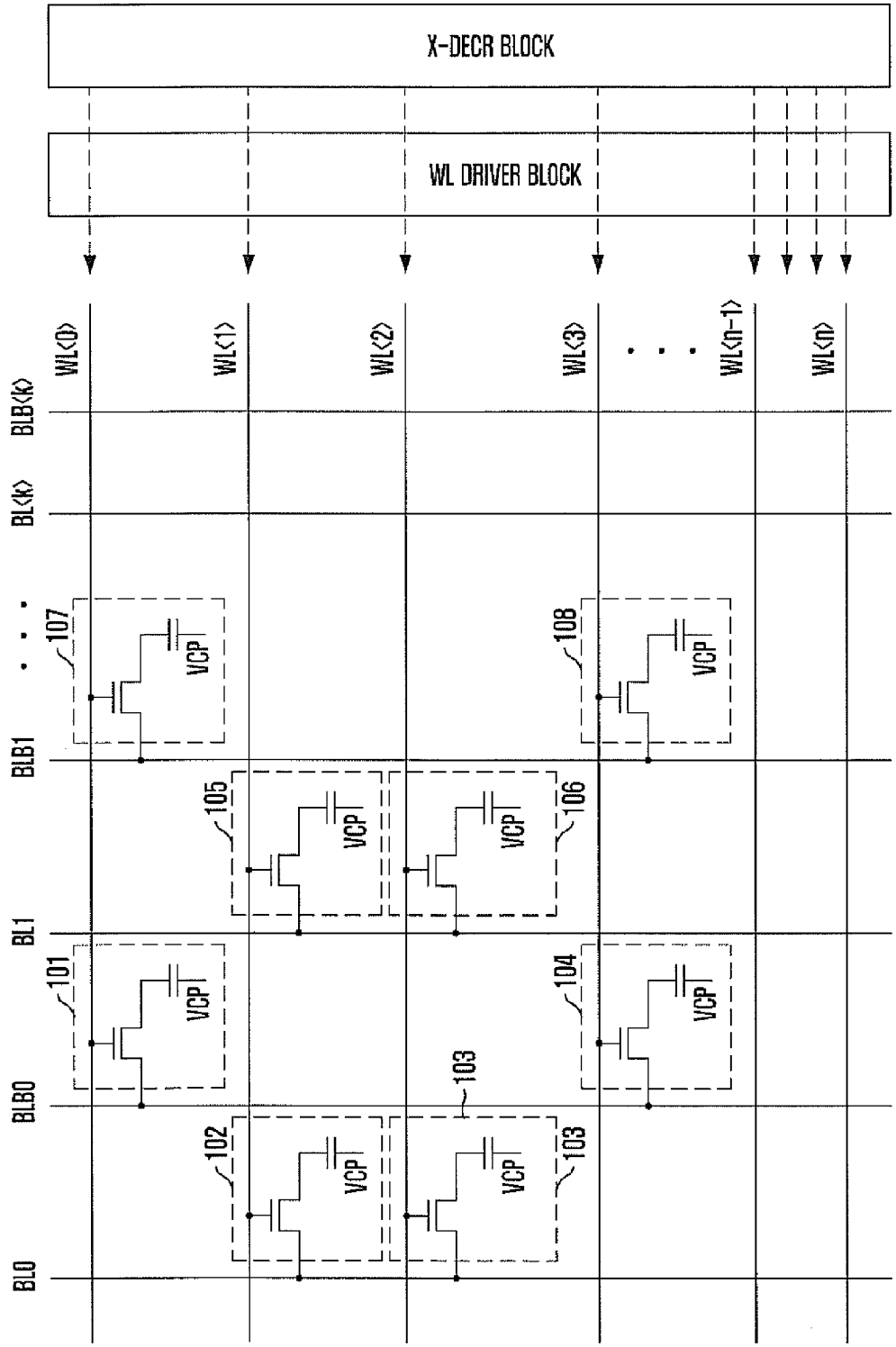
FIG. 1 illustrates a memory cell structure of a conventional semiconductor memory device.
Figure 2:
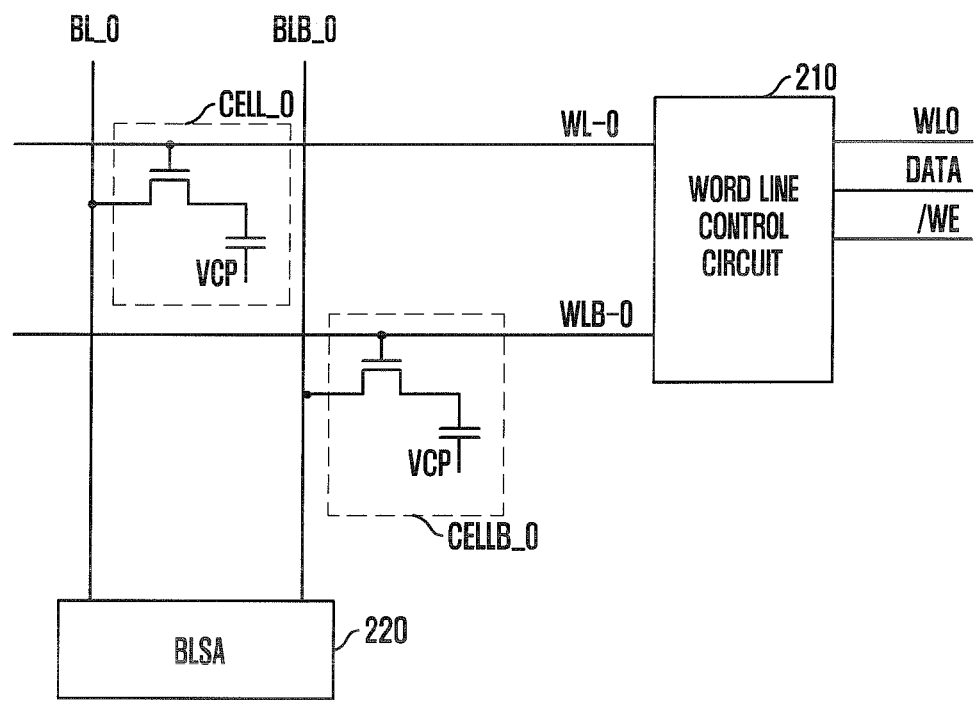
FIG. 2 illustrates a memory cell structure of a semiconductor memory device in accordance with an embodiment of the present invention.

FIG. 2 illustrates a memory cell structure of a semiconductor memory device in accordance with a preferred embodiment of the invention.

Referring to FIG. 2, the semiconductor memory device includes a data storage unit for storing a bit of data. The data storage unit includes a memory cell CELL_0, which is connected to a positive bit line BL_0 and controlled by a positive word line WL_0, and a memory cell CELLB_0, which is connected to a negative bit line BLB_0 and controlled by a negative word line WLB_0.

That is, the semiconductor memory device uses two capacitors and two transistors at the same time to store one bit of data.

The positive word line WL_0 and the negative word line WLB_0 are selected by the same row address. That is, it can be considered that an existing word line WL0 is divided into the positive word line WL_0 and the negative word line WLB_0. For example, when a decoded row address is 0, the word line WL0 is selected in the related art, but the positive word line WL_0 and the negative word line WLB_0 are selected in accordance with the embodiment of the invention.

A word line control circuit 210 enables one of the positive word line WL_0 and the negative word line WLB_0 in a write operation. When data to be stored is a logic high data, the word line control circuit 210 stores logic low data in the memory cell CELLB_0 by enabling the negative word line WLB_0. When data to be stored is a logic low data, the word line control circuit 210 stores logic low data in the memory cell CELL_0 by enabling the positive word line WL_0. That is, the word line control circuit 210 stores only logic low data in the memory cells CELL_0 and CELLB_0 irrespective of the logic level of the external data, either high or low.

In order to enable the positive word line WL_0 or the negative word line WLB_0 having an address of 0, the word line WL0 must be selected as the decoding result of a row address. In this case, it is assumed that WL0, which is the same as the conventional word line signal, is activated.

In a read operation, the word line control circuit 210 simultaneously enables the positive word line WL_0 and the negative word line WLB_0. When logic low data has already been stored in the memory cell CELLB_0 a voltage of the negative bit line BLB_0 becomes lower than that of the positive bit line BL_0 by charge sharing. Accordingly, when a bit line sense amplifier (BLSA) 220 amplifies voltages of the bit lines BL_0 and BLB_0, the voltage of the positive bit line BL_0 is amplified to a high level, and the voltage of the negative bit line BLB_0 is amplified to a low level. That is, data is recognized as "high", and logic high data are output to the outside of the semiconductor memory device.

When logic low data has already been stored in the memory cell CELL_0, a voltage of the positive bit line BL_0 becomes lower than that of the negative bit line BLB_0 by charge sharing. Accordingly, when a bit line sense amplifier (BLSA) 220 amplifies voltages of the bit lines BL_0 and BLB_0 the voltage of the positive bit line BL_0 is amplified to a low level and the voltage of the negative bit line BLB_0 is amplified to a high level. At this point, data is recognized as "low", and logic low data are output to the outside of the semiconductor memory device.

That is, the semiconductor memory device stores logic low data in only the memory cell CELL_0 or the memory cell CELLB_0 according to the logic level of the input data in a write operation. On the other hand, the semiconductor memory device recognizes logic high data or logic low data by charge sharing the memory cells CELL_0 and CELLB_0 to the pair of the bit lines BL_0 and BLB_0 respectively.

The semiconductor memory device in accordance with the preferred embodiment of the invention performs the column operations, for example, decoding of column addresses, amplification of the bit line sense amplifier, and input/output of data, in the same manner as the conventional semiconductor memory device. Also, since the row operation (until the selection of the word line), that is, the operation until the word line signal WL0 (which is the same as the conventional word line signal) is activated, is the same as the related art, detailed description will be omitted.

Figure 3:
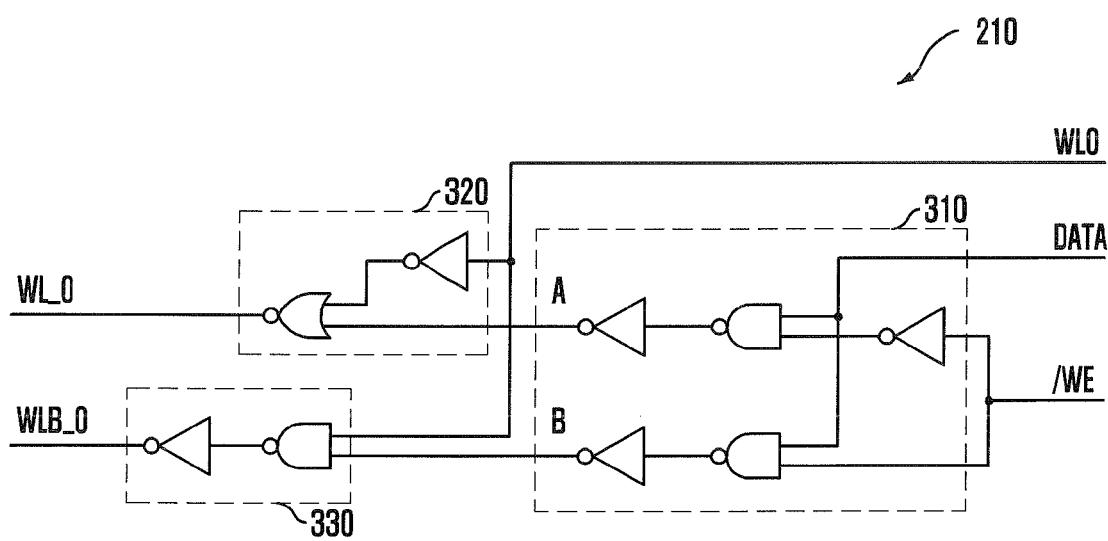
FIG. 3 is a circuit diagram of a word line control circuit (210) of FIG. 2.

FIG. 3 is a circuit diagram of the word line control circuit 210 of FIG. 2.

Referring to FIG. 3, the word line control circuit 210 includes a data detector 310, a positive word line driver 320, and a negative word line driver 330.

DATA denotes data to be written, and a write signal /WE is a signal generated from a write enable signal that is a command discriminating the read operation and the write operation. A case where the write signal /WE is activated to a low level indicates that the write operation is in progress, whereas a case where the write signal /WE is deactivated to a high level indicates that the read operation is in progress. Moreover, the word line signal WL0 denotes the same as a signal applied to a conventional word line.

In the write operation where the write signal /WE is activated (i.e., /WE=LOW), the data detector 310 activates a negative word line signal B to a high level when the data DATA is logic high, and it activates the positive word line signal A to a low level when the data DATA is logic low. However, when the write signal /WE is deactivated (i.e., /WE=HIGH), the data detector 310 activates both of the negative word line signal B and the positive word line signal A.

The positive word line driver 320 drives the positive word line WL_0 to a logic high level when the word line signal WL0 is activated to a logic high level in such a state that the positive word line signal A is activated to a logic low level.

The negative word line driver 330 drives the negative word line WLB_0 to a logic high level when the word line signal WL0 is activated to a logic high level in such a state that the negative word line signal B is activated to a logic high level.

That is, the word line control circuit 210 detects the logic level of the data DATA in the write operation. When the data DATA is logic high, the word line control circuit 210 controls the negative word line WLB_0 to be enabled by the word line signal WL0. When the data DATA is logic low, the word line control circuit 210 controls only the positive word line WL_0 to be enabled by the word line signal WL0.

On the other hand, in the read operation, the word line control circuit 210 controls both the positive word line WL_0 and the negative word line WLB_0 to be enabled when the word line signal WL0 is activated.

A method for operating the semiconductor memory device in accordance with an embodiment of the invention will be described below with reference to FIGS. 2 and 3.

In the method of operating the semiconductor memory device in accordance with the embodiment of the invention, the write operation includes: detecting a logic level of DATA to be written; and enabling the positive word line WL, which controls the memory cell CELL connected to the positive bit line BL, or the negative word line WLB, which controls the memory cell CELLB connected to the negative bit line BLB, according to the detected logic level of the data DATA.

Also, the read operation of reading the written data includes enabling both the positive word line WL_0 and the negative word line WLB_0.

As described above, the semiconductor memory device in accordance with the embodiment of the invention always stores only the logic low data in the memory cells, irrespective of logic level of the external data, either high or low. Therefore, the semiconductor memory device can increase the data retention time of the memory cell, without data loss, thereby improving a refresh characteristic of the semiconductor memory device.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a data storage unit configured to store a data, the data storage unit including:
   a first memory cell connected to a positive bit line and configured to be controlled by a positive word line; and
   a second memory cell connected to a negative bit line and configured to be controlled by a negative word line; and
   a word line control circuit configured to enable one of the positive word line and the negative word line in response to a logic level of the data during a write operation, wherein a logic low data is stored in one of the first and second memory cells, which is controlled by the enabled word line, irrespective of the logic level of the data, wherein the positive word line and the negative word line are selected by a same row address.

2. The semiconductor memory device as recited in claim 1, wherein the word line control circuit enables both the positive word line and the negative word line during a read operation.

3. A semiconductor memory device, comprising:
   a positive word line configured to control a first memory cell connected to a positive bit line;
   a negative word line configured to control a second memory cell connected to a negative bit line; and
   a word line control circuit configured to enable one of the positive word line and the negative word line according to a logic level of a data in a write operation,
   wherein a logic low data is stored in one of the first and second memory cells, which is controlled by the enabled word line, irrespective of the logic level of the data.

4. The semiconductor memory device as recited in claim 3, wherein the word line control circuit enables both the positive word line and the negative word line in a read operation.

5. The semiconductor memory device as recited in claim 3, wherein the positive word line and the negative word line are selected by a same row address.

6. The semiconductor memory device as recited in claim 4, wherein the word line control circuit includes:
   a data detector configured to activate a negative word line signal when the data is logic high, to activate a positive word line signal when the data is logic low in response to a write signal, and to activate both the negative word line signal and the positive word line signal when the write signal is deactivated;
   a positive word line driver configured to drive the positive word line in response to the positive word line signal and a selected word line signal that is selected by an address; and
   a negative word line driver configured to drive the negative word line in response to the selected word line signal and the negative word line signal.

7. The semiconductor memory device as recited in claim 3, wherein the positive word line is provided in plurality, the negative word line is provided in plurality, and the word line control circuit is provided in plurality.

8. A method for operating a semiconductor memory device, the method comprising:
   detecting a logic level of a data to be written;
   enabling a positive word line, which controls a first memory cell connected to a positive bit line, or a negative word line, which controls a second memory cell connected to a negative bit line, according to the detected logic level of the data; and
   writing a logic low data to one of the first and second memory cells, which is controlled by the enabled word line, irrespective of the detected logic level of the data.

9. The method as recited in claim 8, further comprising:
   enabling both the positive word line and the negative word line in reading the written data.

* * * * *